United States Patent [19]

Petersen

[11] Patent Number: 5,358,421
[45] Date of Patent: Oct. 25, 1994

[54] ZERO-INSERTION-FORCE SOCKET FOR GULL WING ELECTRONIC DEVICES

[75] Inventor: Kurt H. Petersen, Austin, Tex.

[73] Assignee: Minnesota Mining and Manufacturing Company, St. Paul, Minn.

[21] Appl. No.: 103,080

[22] Filed: Aug. 6, 1993

[51] Int. Cl.⁵ ............................................. H01R 11/22
[52] U.S. Cl. ..................... 439/266; 439/331; 439/73
[58] Field of Search ............. 439/70, 72, 73, 266–270, 439/330, 331, 259, 264

[56] References Cited

U.S. PATENT DOCUMENTS

| | | | |
|---|---|---|---|
| 4,461,525 | 7/1984 | Griffin | 439/368 |
| 4,623,208 | 11/1986 | Kerne et al. | 439/266 |
| 4,678,255 | 7/1987 | Carter | 439/267 |
| 4,715,823 | 12/1987 | Ezura et al. | 439/267 |
| 4,846,703 | 7/1989 | Matsuoka et al. | 439/71 |
| 4,846,704 | 7/1989 | Ikeya | 439/72 |
| 4,886,470 | 12/1989 | Billman et al. | 439/266 |
| 4,993,955 | 2/1991 | Savant | 439/73 |
| 5,076,798 | 12/1991 | Uratsuji | 439/269 |
| 5,108,302 | 4/1992 | Pfaff | 439/266 |
| 5,114,358 | 5/1992 | Myers | 439/266 |
| 5,154,619 | 10/1992 | Matsuoka | 439/72 |
| 5,154,620 | 10/1992 | Martucci et al. | 439/73 |
| 5,195,903 | 3/1993 | Uratsuji | 439/266 |

FOREIGN PATENT DOCUMENTS 4-154065  5/1992  Japan .

OTHER PUBLICATIONS

Pat. Appln. USSN 07/992852, "Top-Load Socket for Integrated Circuit Device", by John A. Savant, filed Dec. 6, 1992.
Pat. Appln. USSN 07/992478, "Top-Load Socket for Integrated Circuit Device", by John A. Savant, filed Dec. 6, 1992.

*Primary Examiner*—Larry I. Schwartz
*Assistant Examiner*—Hien D. Vu
*Attorney, Agent, or Firm*—Gary L. Griswold; Walter N. Kirn; David W. Anderson

[57] ABSTRACT

A zero-insertion-force test socket is provided which utilizes a unique contact structure to reduce the overall force necessary to actuate the socket while retaining a high contact force. Two separate contact spring portions are used to isolate that portion of the contact which supplies contact pressure from that portion of the contact which allows travel of the contact away from the path of a device to be inserted into the socket.

6 Claims, 7 Drawing Sheets

ZERO-INSERTION-FORCE SOCKET FOR GULL WING ELECTRONIC DEVICES

FIELD OF THE INVENTION

The present invention relates generally to test sockets for electronic devices and more particularly to zero-insertion-force (ZIF) sockets for electronic devices having gull-wing shaped contacts.

BACKGROUND OF THE INVENTION

Electronic devices typically comprise one or more electrical circuits encapsulated in a polymer such as epoxy. Electrically conductive leads from the circuits extend through the encapsulant for connection to other electronic devices. One particular lead arrangement is the so-called "gull wing" arrangement wherein the leads extend from the midpoint of the height of the encapsulated package, downwardly to a point slightly below the lower surface of the package and outwardly parallel to this surface.

To test such devices it is typical to place the device in a test socket attached to a test apparatus including a printed circuit board and electrically operate the device, sometimes in an elevated temperature environment. The test socket must be designed to easily allow rapid insertion and withdrawal of the device without damaging the device leads. Most desirable types of sockets include a zero-insertion-force (ZIF) or zero-insertion-pressure (ZIP) arrangement wherein the device can be inserted into or withdrawn from the socket without placing any stress on the package leads. These types of sockets are distinct from sockets which utilize frictional interference between the leads and the socket contacts to provide the necessary electrical contact between the device and the socket.

One of a large number of ZIF sockets is described in U.S. Pat. No. 5,195,903 wherein a series of contacts are operated by a lever to move toward and away from a device inserted into a well in the center of the socket. The contacts move in a arc up and away from the leads of the device as the socket lever is actuated. A spring portion of the contact is provided to accommodate this motion and provide the spring force necessary to make adequate electrical contact with the leads of the device. The problem with this arrangement is that the spring portion of the contact must perform two functions and thus is something of a compromise. If the spring constant of the contact is set high in order to increase the contact force on the device leads, as by increasing the section of the spring portion of the contact, the necessary operating force is also increased. On the other hand, if the spring constant of the contact is set low, in order to reduce necessary operating force, the contact force is also reduced. Thus existing ZIF sockets for gull wing devices have the inherent disadvantage in that it is difficult to provide a design which allows both the necessary operating force to be reduced as much as possible and the contact force to be increased.

SUMMARY OF THE INVENTION

The present invention overcomes the deficiencies of the prior art by providing a ZIF socket for gull wing type electronic devices which separates the functions of providing contact force and withdrawing the contact from the device so that each can be optimized by providing a test socket for an electronic device having leads for electrical contact with another device, the test socket comprising a base, at least one row of contacts mounted on the base, each contact including a first spring portion terminating in a fulcrum, a second spring portion extending from the fulcrum and terminating in a contact tip for contact with the electronic device, a lever mounted on the fulcrum of the row of contacts and including a fulcrum socket engaging the contact fulcrums, a cam-follower arm and an actuating arm disposed opposite the fulcrum with respect to the cam-follower arm, and a cover movable between a rest position spaced from the base and a contact actuation position spaced a lesser distance from the base than the rest position, the cover including cam surfaces for interacting with the lever as the cover is moved from the rest position to the actuation position to lift the contact tips from the device leads in the direction opposite the movement of the cover by flexing the second spring portions without substantially affecting the first spring portions and subsequently to flex the first spring portions to retract the contact tips from the device leads in a direction substantially perpendicular to the direction of movement of the cover.

The cover preferably includes two separate cam surfaces, the first of which interacts with the cam-follower arm to pivot the lever as the cover is depressed a first distance and the second of which moves the lever perpendicular to the movement of the cover as the cover is depressed further. Also preferably, the first spring portion is a straight beam extending perpendicularly with respect to the base and the second spring portion is a circular spring extending from adjacent the fulcrum to the contact tip.

BRIEF DESCRIPTION OF THE DRAWINGS

The present invention will be more thoroughly described with respect to the accompanying drawings, wherein like numbers refer to like parts in the several views, and wherein.

DESCRIPTION OF THE PREFERRED EMBODIMENT

Figure 1:
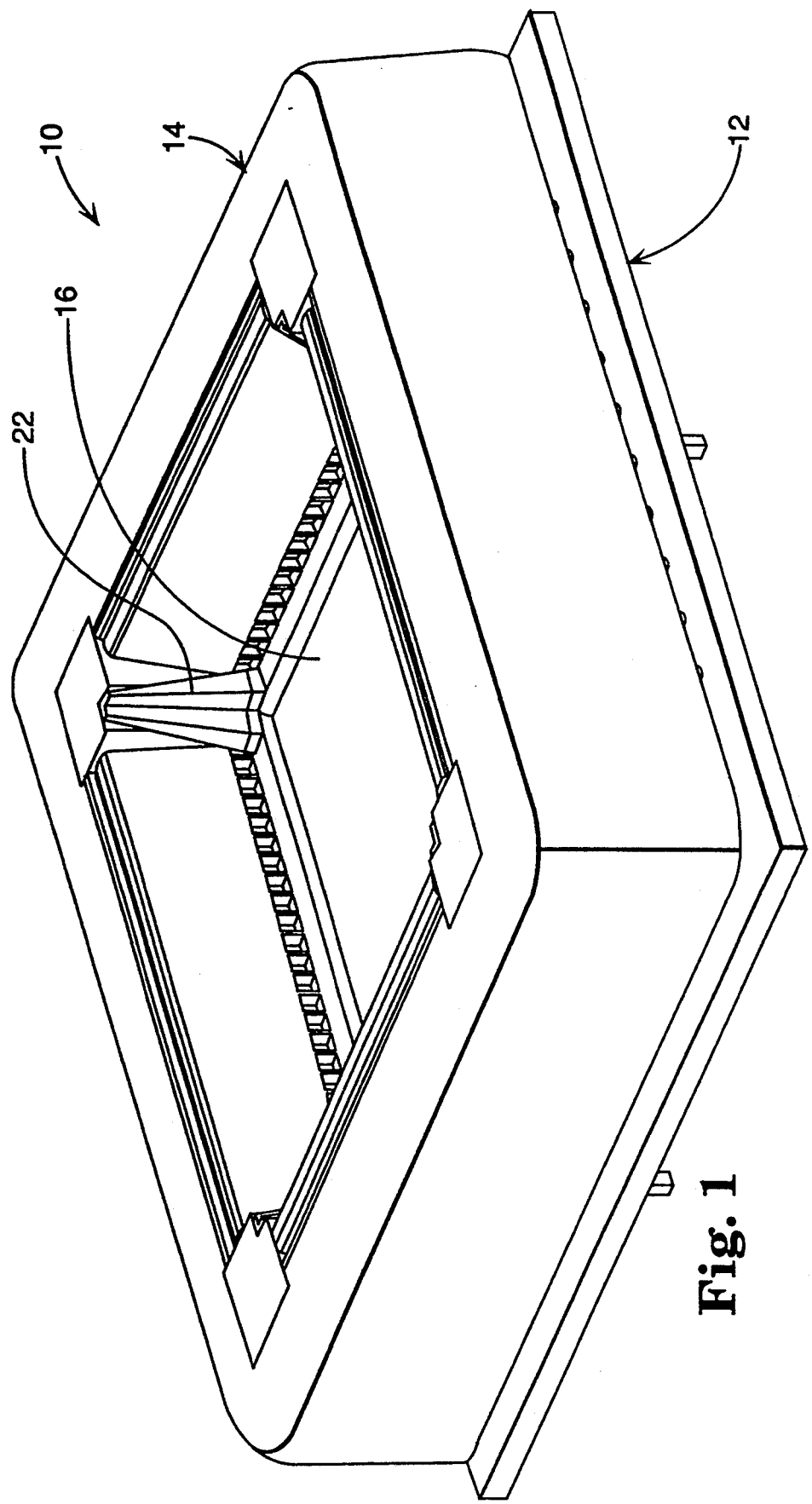
FIG. 1 is a perspective view of a test socket according to the present invention.

FIG. 1 illustrates a ZIF test socket, generally indicated as 10, which includes a base 12 and a cover 14. The cover 14 is open in the center to define a well allowing access to a platform 16 mounted on the base 12. The platform 16 is provided to support an electronic device 18 which includes leads 20 of the "gull wing" type which extend outwardly from the body of the device 18 and slightly below and parallel to one major surface of the device 18. Posts 22 at the corners of the platform 16 guide the device to a desired position on the platform 16.

The purpose of the test socket 12 is to temporarily connect the device 18 to a testing apparatus (not shown) which usually includes a circuit board adapted to electrically exercise the device 18 to determine functionality. These electrical test are frequently conducted in an elevated temperature environment.

Figure 2:
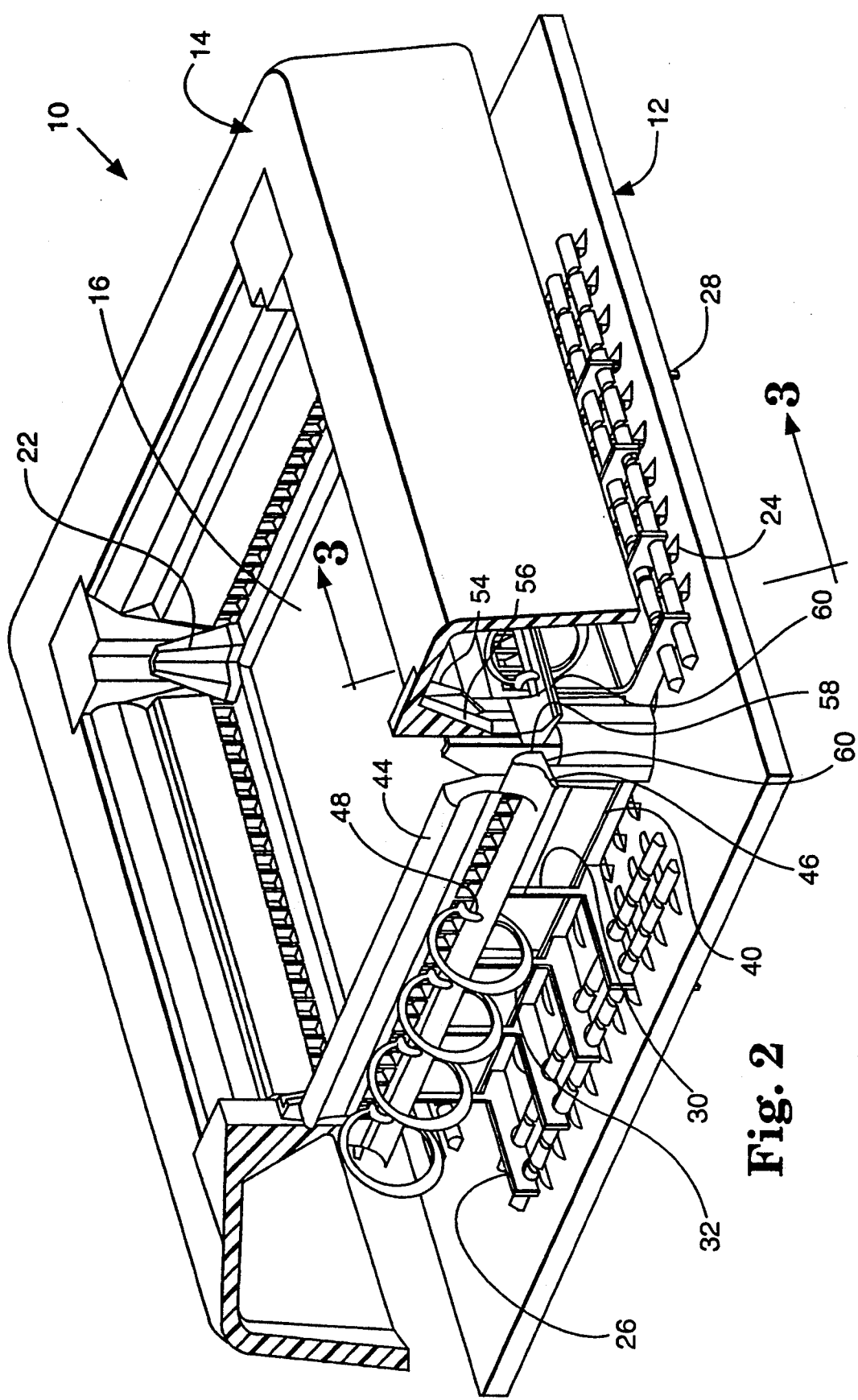
FIG. 2 is a perspective view of the test socket of FIG. 1 with a portion of its cover and other parts removed.

FIG. 2 illustrates the test socket with a portion of the cover broken away to show interior details. It will be seen that the base 12 includes holes 24 into which are mounted contacts 26. Not all contacts 26 are shown for clarity of the drawing. As better seen in FIG. 3, the contacts 26 include pins 28 which extend through the holes 24 in the base 12 to attach the contacts 26 to the base 12 and to provide for electrical connection of the contacts 26 to the circuit board of the test apparatus.

Since the purpose of the test socket 12 is to temporarily connect a device to a test apparatus in a production setting, it is a requirement that the socket allow for the rapid and easy exchange of devices. Also, the socket must make reliable contact with the leads of the device in test without causing damage to the device. Such sockets have evolved to typically include a cover which may be depressed by hand or by automatic placement equipment to withdraw the contacts of the test socket from the path of the leads of the device as it is placed in the socket. Once the device is in place, the cover is released to cause and allow the contacts to engage the leads of the device. Such sockets are known as zero-insertion-force (ZIF) sockets since it is not necessary to force the leads of the device into or under a contact which frictionally interacts with the leads. The present test socket 12 differs from those developed in the past in that the structure which creates pressure engagement between the contacts 26 and the leads 20 is separate from the structure which allows the contacts 26 to withdraw from the path of the leads 20 so the device 18 may be inserted into or removed from the socket 12.

As best seen in FIGS. 3–7, these structures are a first spring portion 30 which extends substantially perpendicularly upward with respect to the base 12 and a second spring portion 32 in the shape of a circle which terminates in a contact tip 34 adapted to engage the leads 20 of the device 18.

The contacts 26 are preferably stamped from sheet material, preferably a metal and more preferably copper or a copper alloy, and thus the first spring portion 30 is preferably rectangular in cross-section. The first spring portion 30 terminates in a rounded end defining a fulcrum 36 which is aligned with the axis of the first spring portion 30.

Mounted atop the fulcrums 36 of a series of contacts 26 is a lever 40 having a socket 42 engaging the contact fulcrums 36. The lever 40 is shaped to include a cam-follower arm 44 and an actuating arm 46 extending substantially perpendicularly to the cam-follower arm 44. Divergence between the two arms 44 and 46 occurs approximately at the socket 42 of the lever 40. The contact 26 includes a tail 48 adjacent the contact tip 34 which rides along the upper surface 50 of the actuating arm 46 and which forces the actuating arm 46 against a flat surface 52 adjacent the fulcrum 36 by virtue of the resiliency of the contact 26 and, in particular, the second spring portion 32. The cover 14 includes cam surfaces which interact with the lever 40 to manipulate the lever 40 and consequently the contacts 26. This structure of the cover 14 and operation of the lever will be described with respect to FIGS. 3–7 which sequentially illustrate the steps of inserting a device 18 into the socket 10.

Figure 3:
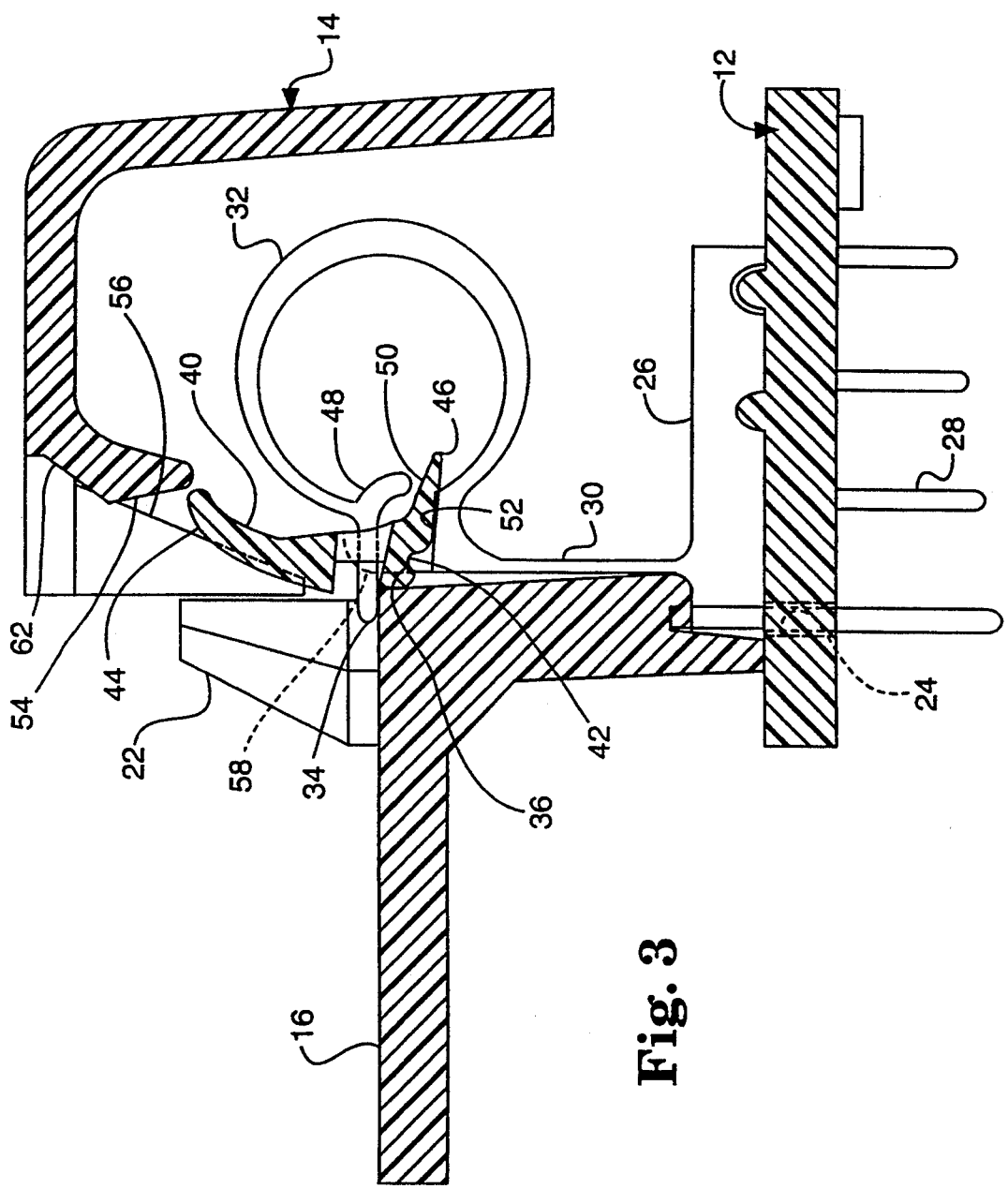
FIG. 3 is a cross-sectional view of a portion of the present invention taken generally along the line 3—3 of FIG. 2.

In FIG. 3 the test socket 10 is at rest with the cover 14 not in contact with the lever 40 and the second spring portion 32 of the contact 26 forcing the lever 40 against the flat surface 52. The second spring portion 32 also forces the contact tip 34 into contact with the platform 16. Although not shown, it is contemplated that the cover 14 will be supported above and attached to the base 12 by posts and springs located in the corners of the base 12 and the cover 14.

Figure 4:
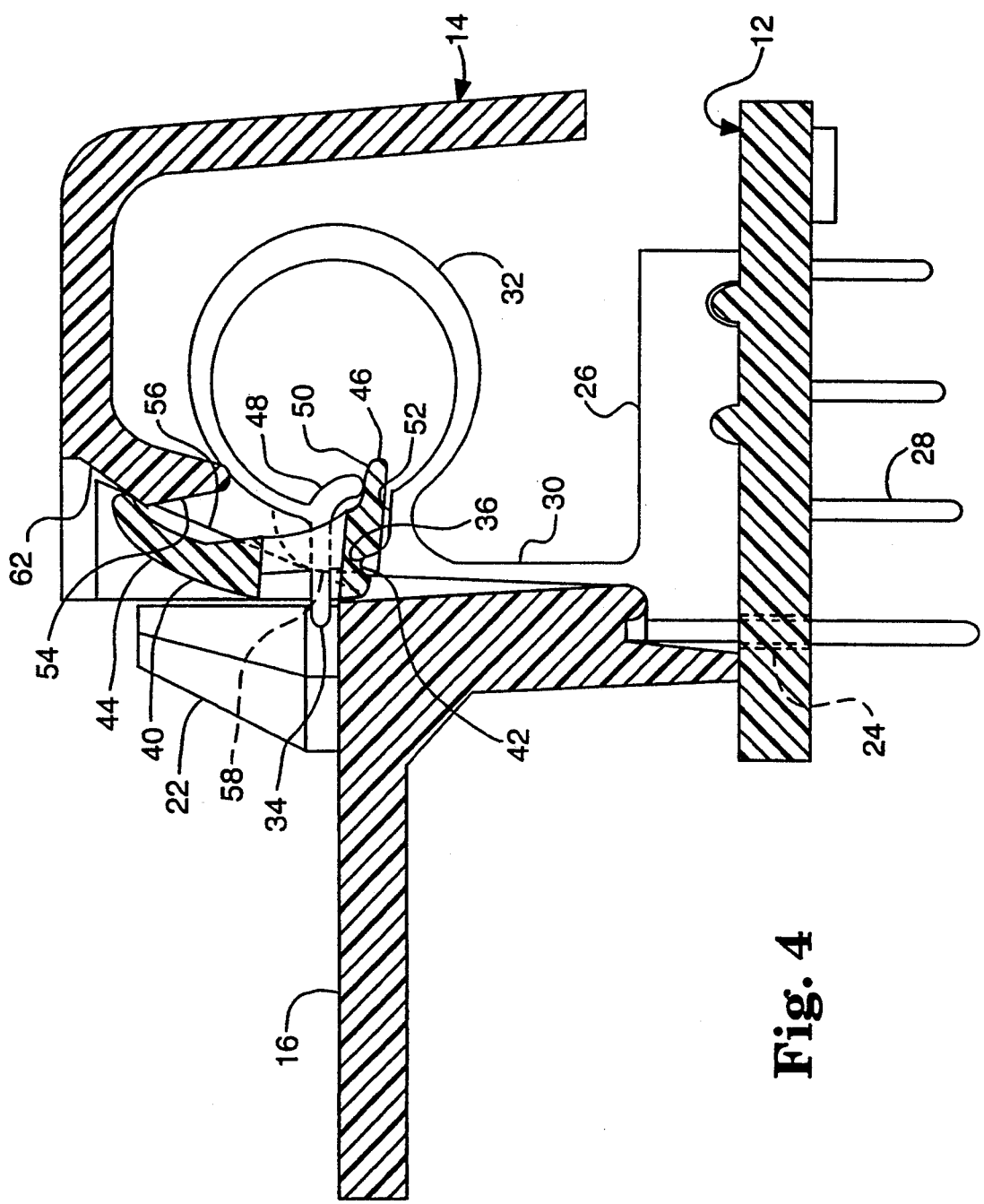
FIG. 4 is a view similar to FIG. 3 with the cover slightly depressed.

FIG. 4 illustrates the cover 14 partially depressed toward the base 12. During this motion of the cover 14 the end of the cam-follower arm 44 has been engaged by a first cam surface 54 of the cover 14 forcing the lever 40 to pivot counterclockwise around the fulcrum 36 such that the actuating arm 46 is lifted off the surface 52 and consequently moves the contact tip 34 away from the platform 16 in the direction opposite the movement of the cover 14 toward the base 12. It will be noted that the contact tip 34 has not moved horizontally away from the platform 16 and the first spring portion 30 remains substantially perpendicular with respect to the base 12.

Figure 5:
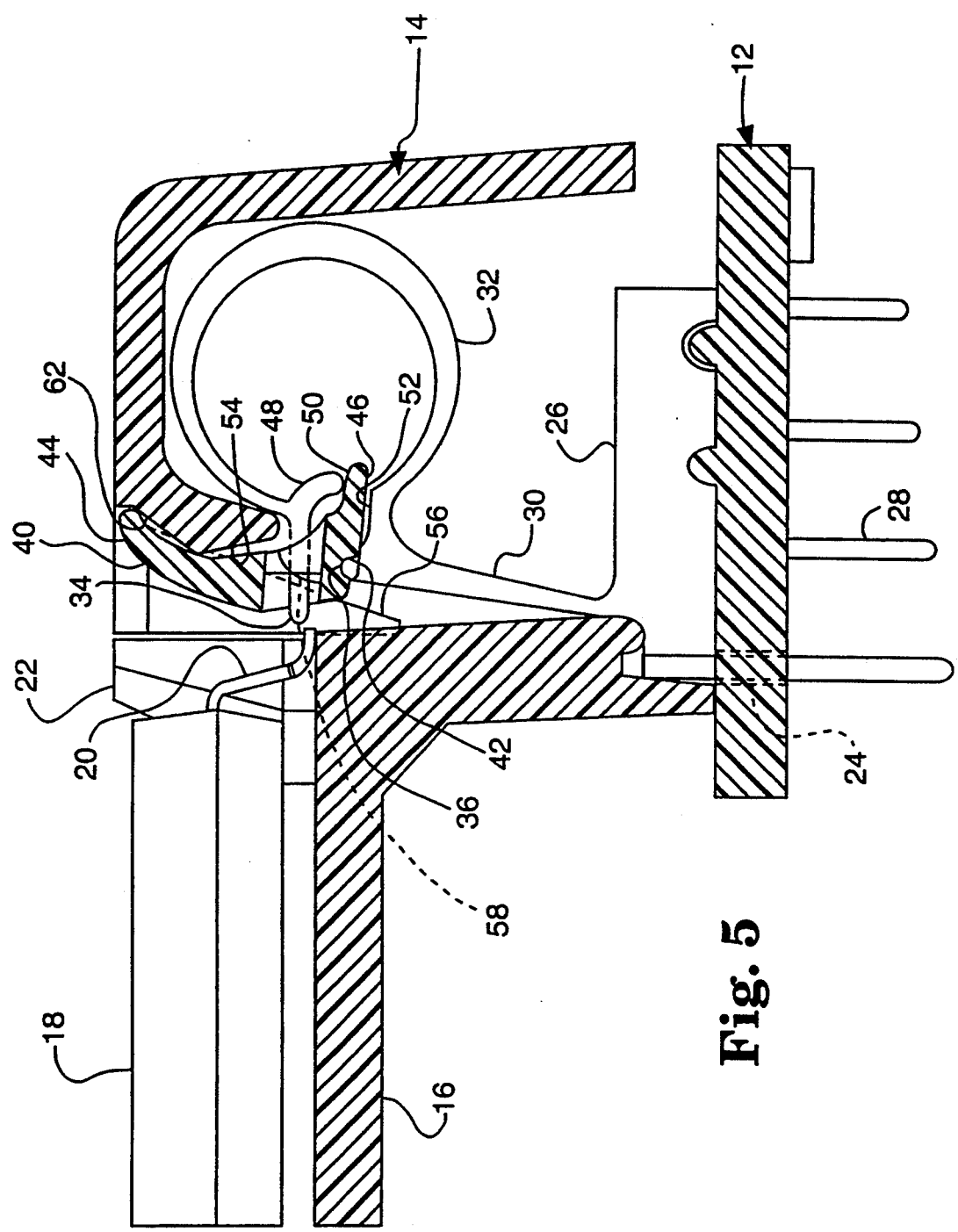
FIG. 5 is a view similar to FIG. 3 with the cover completely depressed and an electronic device installed in the test socket.

FIG. 5 illustrates the cover 14 in its fully depressed position. In traveling from the position shown in FIG. 4 to that shown in FIG. 5, second cam surfaces 56 formed as part of the cover 14 and disposed adjacent the ends of the lever 40 descend to contact a rounded surface 58 of the lever 40 which is formed as a part of projections 60 (FIG. 2) extending from each end of the lever 40. These second cam surfaces 56 causes the lever 40 to travel away from the platform 16 in a direction perpendicular to the movement of the cover 14. Since the lever 40 engages the contacts 26 at the fulcrum 36, the upper portion of the contact 26 follows the lever 40 by flexing the first spring portion 30. It will be noted that the cover 14 includes a relief surface 62 formed above the first cam surface 54 which allows the lever 40 to move away from the platform 16 without further rotation of the lever 40 or flexing of the second spring portion 32. The important function of the relief surface 62 is that it allows the lever 40 and the second spring portion 32 of the contacts 26 to move away from the platform 16 without the second spring portion 32 being flexed further than was necessary to lift it from the platform 16. Thus energy is not wasted in unnecessary motion of the second spring portion 32 beyond that absolutely necessary. FIG. 5 illustrates that once the cover 14 has been fully depressed, and thus the contact tip 34 fully withdrawn from the platform 16, the platform 16 is clear for positioning of the electronic device 18 on the platform 16.

Figure 6:
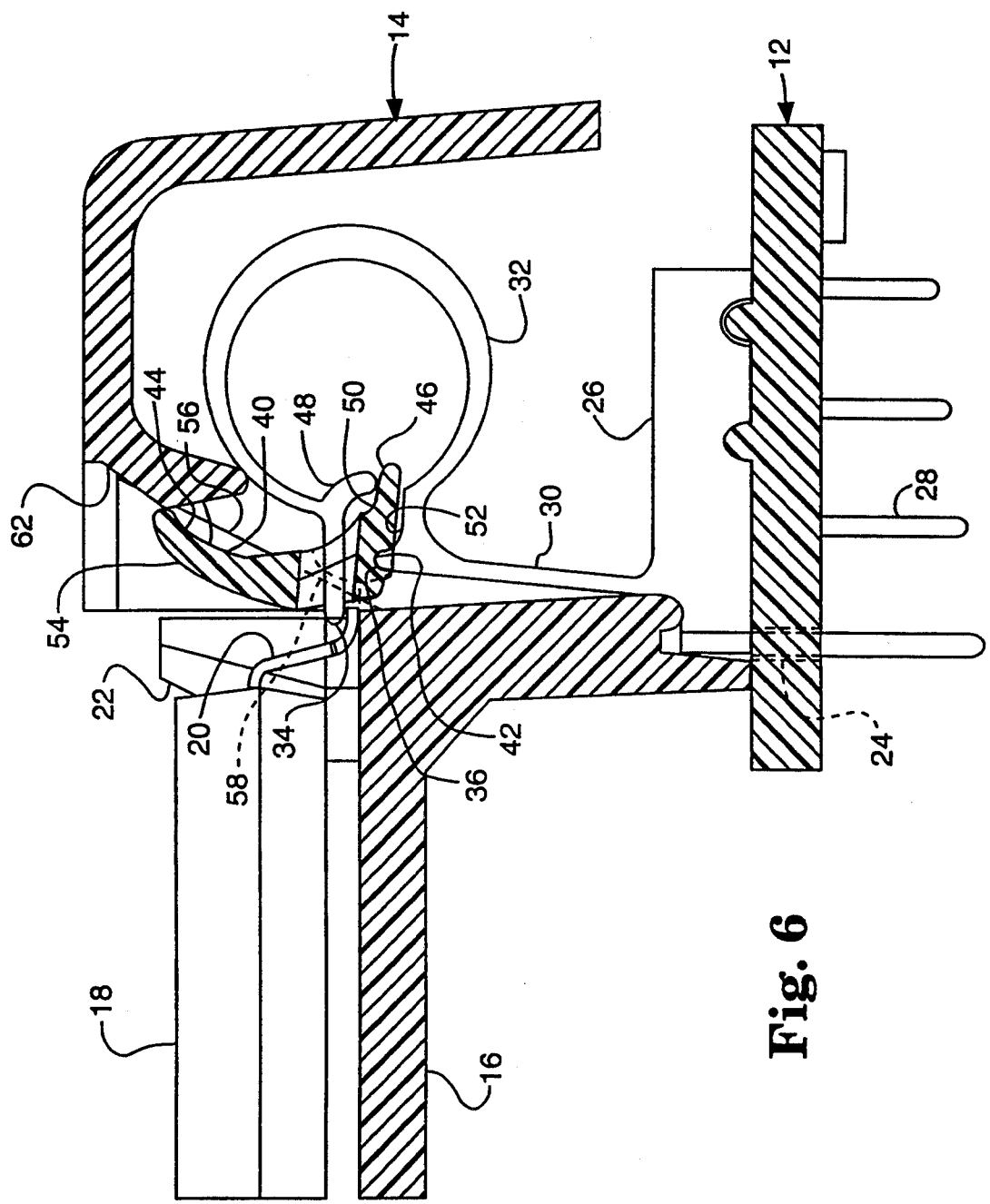
FIG. 6 is a view similar to FIG. 5 with the cover raised partially.

FIG. 6 illustrates the electronic device 18 in place on the platform 16 and the cover 14 partially released to allow the contact tip 34 to approach the leads 20 of the device 18 for contact. In moving from the position of FIG. 5 to the position of FIG. 6, the second cam surfaces 56 have retreated toward the platform 16 and allowed the rounded surface 58 of the lever 40 (and the lever 40 itself) to approach the platform 16 in response to biasing created by the resiliency of the first spring portion 30. It will be seen that the positioning of all elements of the test socket 10 have returned to the position illustrated in FIG. 4 wherein the cover 14 was partially depressed from its rest position.

Figure 7:
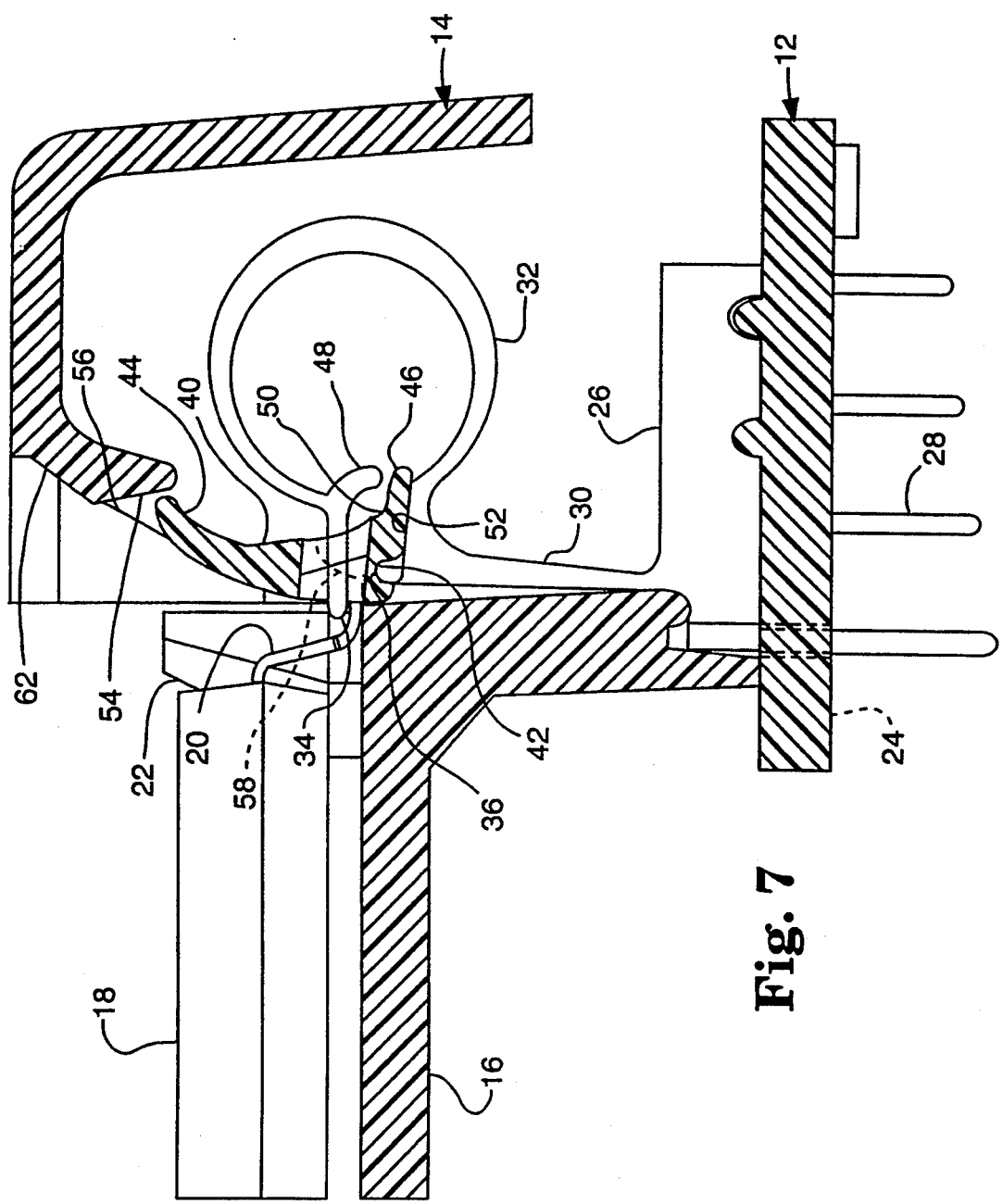
FIG. 7 is view similar to FIG. 5 with the cover raised completely.

FIG. 7 illustrates the device 18 in place on the platform 16 and the cover 14 fully retracted to its initial rest position. The first cam surface 54 of the cover 14 has allowed the lever 40 to rotate clockwise around the fulcrum 36 thus permitting the contact tips 34 to lower and make contact with the leads 20 of the device 18 under the impetus of the resiliency of the second spring portion 32. Future lowering and raising of the cover 14 will repeat the steps illustrated in FIGS. 3 through 7 and allow one device 18 to be replaced by another when the cover 14 is fully depressed.

Thus there has been described a test socket 10 which includes a number of advances over conventional sockets. Since the functions of supplying contact pressure and allowing for the withdrawal of the contact tip 34 from the path of the device 18 have been separated, the spring rates of the two elements can be optimized. Thus the arcuate second spring portion 32 can be made relatively heavy to supply strong, reliable contact force since this spring 32 is only flexed a very small amount during the process of clearing the socket 10 for the insertion of an electronic device 18. On the other hand, the first spring portion 30 of the contact 26 can be made relatively light since it is not required that this spring 30 contribute to generation of contact force between the contact tip 34 and the leads 20 of the electronic device 18. The socket 10 described above thus attains high contact forces without requiring a high actuation force. This situation is in contrast to conventional socket wherein a single spring is used to perform both of the functions of providing contact force and allowing travel of the assembly away from the contact area. In this situation, contact force must be compromised to keep actuation forces within reason.

Although the invention has been described with respect to only a single embodiment, many modification will be apparent to those skilled in the art. For example, the specific shapes of the springs, the lever and the actuating cam surfaces may be modified in many ways so long as the purpose of the invention is accomplished, that being the separation of the application of contact force from the provision for contact travel. Also, although the socket has been shown with four rows of contacts surrounding the electronic device, more or fewer rows of contacts could be employed in conjunction with differently configured devices.

I claim:

1. A test socket for an electronic device having leads for electrical contact with another device, the test socket comprising:
    a base;
    at least one row of contacts mounted on said base, each contact including a first spring portion terminating at an end defining a fulcrum and a second spring portion extending from said fulcrum and terminating in a contact tip for contact with the electronic device;
    a lever mounted on said fulcrums of said row of contacts and including fulcrum sockets engaging said contact fulcrums, a cam-follower arm and an actuating arm disposed opposite said fulcrums with respect to said cam-follower arm; and
    a cover movable between a rest position spaced from said base and a contact actuation position spaced a lesser distance from said base than said rest position, said cover including cam surfaces for interacting with said lever as said cover is moved from said rest position to said actuation position to lift said contact tips from the device leads in the direction opposite the movement of said cover by flexing said second spring portions without substantially affecting said first spring portions and subsequently to flex said first spring portions to retract said contact tips from said device leads in a direction substantially perpendicular to the direction of movement of said cover, wherein said cover includes first and second cam surfaces, said first cam surfaces acting on said lever to pivot said lever with respect to said fulcrums as said cover moves a first distance from said rest position toward said base and said second cam surfaces acting to move said lever substantially perpendicularly to the direction of movement of said cover without pivoting said lever as said cover moves beyond said first distance toward said base.

2. A test socket according to claim 1 wherein said first cam surfaces are relieved to cease pivoting of said lever as said cover moves toward said base beyond said first distance.

3. A test socket according to claim 1 wherein said first spring portion is a substantially straight beam extending substantially perpendicularly with respect to said base.

4. A test socket according to claim 3 wherein said second spring portion is substantially circular.

5. A test socket according to claim 4 wherein said second spring portion is largest in cross-section substantially opposite said contact tip.

6. A test socket according to claim 1 wherein said second spring portion is substantially circular to recurve upon itself from said fulcrum to said contact tip.

* * * * *